(12) United States Patent
Wu et al.

(10) Patent No.: US 8,766,293 B2
(45) Date of Patent: Jul. 1, 2014

(54) LIGHT-EMITTING DEVICE AND METHOD FOR MANUFACTURING THE SAME

(75) Inventors: Jyun-De Wu, Tainan (TW); Yu-Chu Li, Tainan (TW)

(73) Assignee: Genesis Photonics Inc., Tainan (TW)

( * ) Notice: Subject to any disclaimer, the term of this patent is extended or adjusted under 35 U.S.C. 154(b) by 66 days.

(21) Appl. No.: 13/568,399

(22) Filed: Aug. 7, 2012

(65) Prior Publication Data

US 2013/0037796 A1 Feb. 14, 2013

(30) Foreign Application Priority Data

Aug. 8, 2011 (TW) ............................... 100128191 A
Aug. 31, 2011 (CN) .......................... 2011 1 0255651
May 28, 2012 (TW) ............................... 101118956 A

(51) Int. Cl.
*H01L 29/205* (2006.01)
*H01L 33/00* (2010.01)
*H01L 21/00* (2006.01)

(52) U.S. Cl.
USPC .................... 257/91; 257/95; 257/98; 257/99; 257/E33.064; 438/22; 438/26; 438/27; 438/29

(58) Field of Classification Search
USPC ..................................... 438/22, 25, 26, 27, 29
See application file for complete search history.

(56) References Cited

U.S. PATENT DOCUMENTS

2005/0199895 A1* 9/2005 Seong et al. ..................... 257/94
2007/0018183 A1* 1/2007 Denbaars et al. ............... 257/98

* cited by examiner

*Primary Examiner* — Benjamin Sandvik
*Assistant Examiner* — Leslie Pilar Cruz
(74) *Attorney, Agent, or Firm* — The Webb Law Firm

(57) ABSTRACT

A light-emitting device includes a first cladding layer, a light-emitting layer, a second cladding layer, an epitaxial structure including an indium-containing oxide, and an electrode unit for supplying external electricity, The electrode unit includes a first electrode disposed to be electrically connected to the first cladding layer, and a second electrode disposed above the epitaxial structure to be electrically connected to the second cladding layer through the epitaxial structure such that the external electricity is permitted to be transmitted to the light-emitting layer through the first and second electrodes. A method for manufacturing the light-emitting device is also disclosed.

16 Claims, 5 Drawing Sheets

| Element | Weight Percent (wt%) |
|---|---|
| Oxygen | 5.67 |
| Gallium | 16.36 |
| Indium | 77.97 |
| Total | 100 |

LIGHT-EMITTING DEVICE AND METHOD FOR MANUFACTURING THE SAME

CROSS-REFERENCE TO RELATED APPLICATION

This application claims priority of Taiwanese application no. 100128191, filed on Aug. 8, 2011 and Taiwanese application no. 101118956, filed on May 28, 2012.

BACKGROUND OF THE INVENTION

1. Field of the Invention

This invention relates to a light-emitting device and a method for manufacturing the same, more particularly to a light-emitting device that includes an epitaxial structure having an indium-containing oxide, and a method for manufacturing the same.

2. Description of the Related Art

Referring to FIG. 1, a conventional light-emitting device includes a substrate 10, a first cladding layer 11, a light-emitting layer 12, a second cladding layer 13, and an electrode unit 14.

Normally, the first cladding layer 11 is made of an n-type semiconductor material, such as an n-type gallium nitride. The second cladding layer 13 is made of a p-type semiconductor material, such as a p-type gallium nitride. The light-emitting layer 12 is sandwiched between the first and second cladding layers 11, 13, and can emit light when supplied with external electricity.

The electrode unit 14 is made of a conductive material, such as a metal or an alloy, and includes a first electrode 141 disposed on the first cladding layer 11, and a second electrode 142 disposed on the second cladding layer 13. When the external electricity is applied to the first and second electrodes 141, 142, it is transmitted to the light-emitting layer 12 through the first and second cladding layers 11, 13.

In order to evenly and laterally distribute the electric current from the second electrode 142 to the second cladding layer 13, and in order to reduce a contact resistance between a conductor (i.e., the second electrode 142) and a semiconductor (i.e., the second cladding layer 23), a transparent conductive layer (not shown) is usually formed on an entire upper surface 131 of the second cladding layer 13. Normally, the transparent conductive layer is formed by sputtering deposition of an indium tin oxide (ITO) material. However, the sputtered indium tin oxide layer has poor adhesion to the second cladding layer 13, which may result in an unduly large contact resistance between the sputtered ITO material layer and the second cladding layer 13. As such, the working voltage of the conventional light-emitting device is relatively high.

SUMMARY OF THE INVENTION

Therefore, an object of the present invention is to provide a light-emitting device and a method for manufacturing the light-emitting device. The light-emitting device manufactured by the method of this invention can be operated at a relatively low working voltage.

According to the first aspect of the present invention, a light-emitting device of comprises:

a first cladding layer made of a first-type semiconductor material;

a light-emitting layer disposed on the first cladding layer to emit light when supplied with external electricity;

a second cladding layer disposed on the light-emitting layer oppositely of the first cladding layer, and made of a second-type semiconductor material which has an electrical property opposite to that of the first-type semiconductor material;

an epitaxial structure including an indium-containing oxide, and formed on the second cladding layer oppositely of the light-emitting layer; and an electrode unit for supplying the external electricity, including a first electrode disposed to be electrically connected to the first cladding layer, and a second electrode disposed above the epitaxial structure to be electrically connected to the second cladding layer through said epitaxial structure such that the external electricity is permitted to be transmitted to the light-emitting layer through the first and second electrodes.

According to a second aspect of the present invention, a method for manufacturing a light-emitting device comprises the steps of:

(a) epitaxially growing a first cladding layer on a substrate, the first cladding layer being made of a first-type semiconductor material;

(b) epitaxially growing a light-emitting layer on the first cladding layer, the light-emitting layer being capable of emitting light when supplied with external electricity;

(c) epitaxially growing a second cladding layer on the light-emitting layer, the second cladding layer being made of a second-type semiconductor material which has an electrical property opposite to that of the first-type semiconductor material;

(d) epitaxially growing an epitaxial structure on the second cladding layer, the epitaxial structure including an indium-containing oxide; and (e) forming a first electrode to be electrically connected to the first cladding layer, and forming a second electrode on the epitaxial structure so as to be electrically connected to the second cladding layer through the epitaxial structure, such that the external electricity is permitted to be transmitted to the light-emitting layer through the first and second electrodes.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
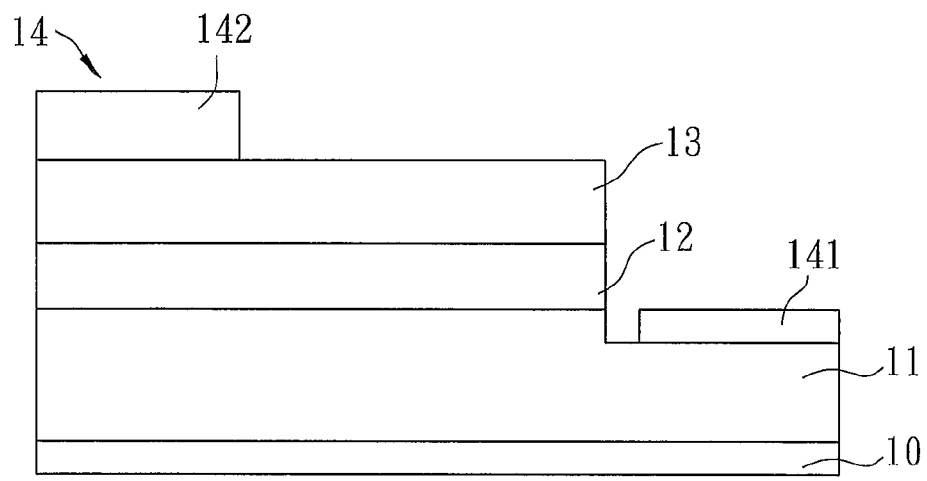
FIG. 1 is a schematic side view of a conventional light-emitting device.

Before the present invention is described in greater detail, it should be noted herein that like elements are denoted by the same reference numerals throughout the disclosure.

Figure 2:
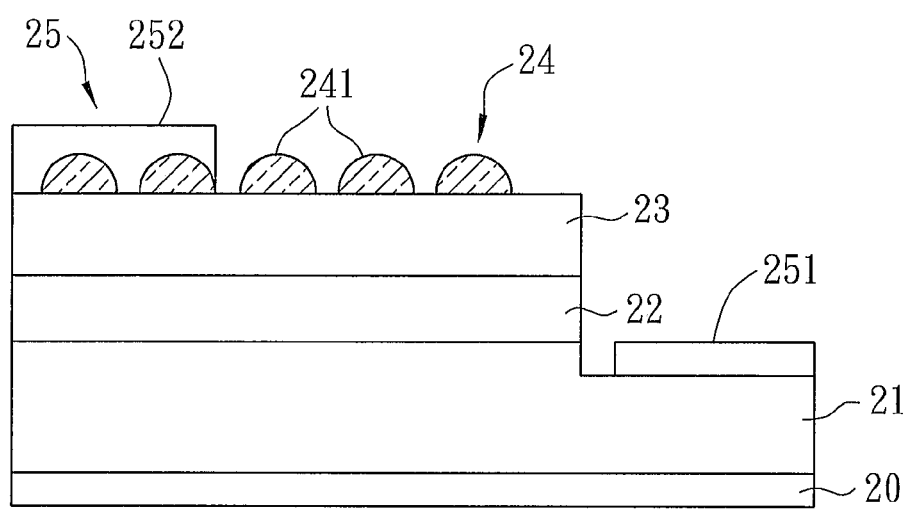
FIG. 2 is a schematic side view of the first preferred embodiment of a light-emitting device according to the present invention.

Referring to FIG. 2, the first preferred embodiment of a light-emitting device according to this invention is of a horizontal type, and comprises a substrate 20, a first cladding layer 21, a light-emitting layer 22, a second cladding layer 23, an epitaxial structure 24, and an electrode unit 25.

The substrate 20 may be made of sapphire or silicon carbide. The first cladding layer 21 is epitaxially grown on the substrate 20 using organometallic vapor phase epitaxy (OMVPE), and is made of a first-type semiconductor material. In this embodiment, the first-type semiconductor material is an n-type gallium nitride based material, and the first cladding layer 21 is made of an n-type gallium nitride.

The light-emitting layer 22 is epitaxially grown on the first cladding layer 21 using OMVPE, and is capable of converting electric energy to light energy so as to emit light when supplied with external electricity. In this embodiment, the light-emitting layer 22 is made of a gallium nitride based material. The light-emitting layer 22 may be a double hetero-junction structure, a single quantum well structure, or a multiple quantum well structure. In the case of the multiple quantum well structure, the light-emitting layer 22 may include alternating barrier films and active films (not shown) formed on the first cladding layer 21. The barrier films are made of gallium nitride (GaN), and the active films are made of indium gallium nitride (InGaN). Since the arrangement of the barrier and active films are well-known in the art, a detailed description thereof is omitted herein for the sake of brevity.

The second cladding layer 23 is epitaxially grown on the light-emitting layer 22 oppositely of the first cladding layer 21 using OMVPE, and is made of a second-type semiconductor material that has an electrical property opposite to that of the first-type semiconductor material. In this embodiment, the second-type semiconductor material is a p-type gallium nitride based material, and the second cladding layer 23 is made of a p-type gallium nitride. Hereinafter, the first cladding layer 21 is referred to as an n-type semiconductor layer, and the second cladding layer 23 is referred to as a p-type semiconductor layer.

Preferably, each of the n-type and p-type semiconductor cladding layers 21, 23, and the light-emitting layer 22 has a single crystal lattice, and is of a hexagonal crystal system.

The epitaxial structure 24 is transparent and electrically conductive, and is epitaxially grown on the p-type semiconductor layer 23 oppositely of the light-emitting layer 22 using OMVPE. The epitaxial structure 24 includes an indium-containing oxide. In this embodiment, the indium-containing oxide is an indium gallium oxide of $In_yGa_{1-y}O$ where $0<y<1$.

As shown in FIG. 2, the epitaxial structure 24 is configured to have a plurality of growth islands 241 formed on the p-type semiconductor layer 23. The OMVPE is not suitable for forming growth islands 241 of a mean width greater than 300 nm, and the growth islands 241 may have poor electrical transmission efficiency if they have a mean width less than 30 nm. Thus, the growth islands 241 preferably have a mean width ranging from 30 nm to 300 nm, and a mean height ranging from 10 nm to 20 nm. A distance between two adjacent ones of the growth islands 241 is greater than 100 nm. Preferably, the epitaxial structure 24 has a single crystal lattice, and is of an orthorhombic crystal system.

In this embodiment, because the p-type semiconductor layer 23 and the epitaxial structure 24 have a single crystal lattice and have regularly arranged atoms, the epitaxial structure 24 has good adhesion to the p-type semiconductor layer 23, and has better electrical conductivity.

The electrode unit 25 is used for supplying the external electricity, and includes a first electrode 251 and a second electrode 252. The first electrode 251 is disposed on and electrically connected to the n-type semiconductor layer 21. The second electrode 252 is disposed to cover a portion of the growth islands 241 of the epitaxial structure 24 and is electrically connected to the p-type semiconductor layer 23 through the epitaxial structure 24. Accordingly, when the external electricity is applied to the light-emitting device, it can be transmitted to the light-emitting layer 22 through the first and second electrodes 251, 252.

It is found that when the epitaxial structure 24 (a metal oxide semiconductor) is formed between the second electrode 252 and the p-type semiconductor layer 23 (i.e., the p-type gallium nitride), a contact resistance between the p-type semiconductor layer 23 and the second electrode 252 is relatively low. This means that the epitaxial structure 24 may enhance the electrical transmission efficiency, especially the hole transmission efficiency, in a vertical direction, and that recombination of electrons and holes in the light-emitting layer 22 may be facilitated, thereby enhancing the quantum efficiency of the light-emitting device of this invention.

The light-emitting device of this invention can be packaged by a normal process, or a flip-chip packaging process.

Figure 3:
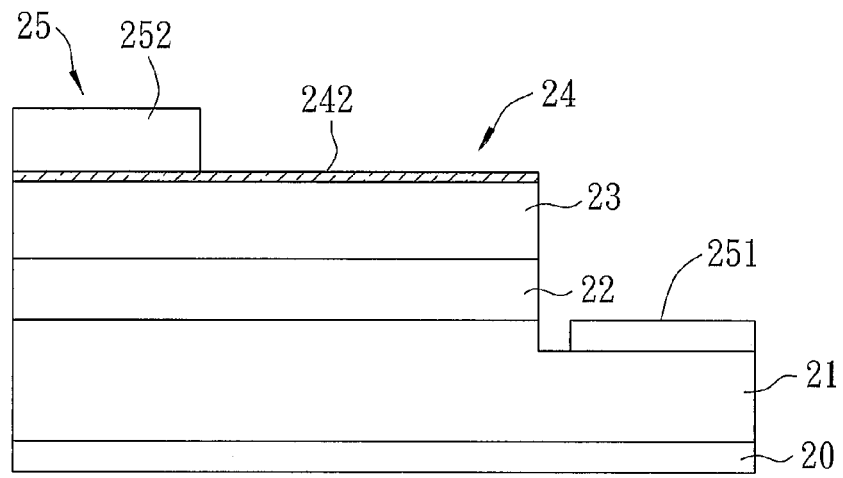
FIG. 3 is a schematic side view of the second preferred embodiment of a light-emitting device according to the present invention.

FIG. 3 illustrates the second preferred embodiment of a light-emitting device according to this invention. The second preferred embodiment is similar to the first preferred embodiment, and differs therefrom in that the epitaxial structure 24 in the second preferred embodiment is configured to have an epitaxial film 242 formed on the p-type semiconductor layer 23. Due to the provision of the epitaxial film 242, not only good adhesion between the epitaxial structure 24 and the p-type semiconductor layer 23 can be achieved, the horizontal electrical transmission efficiency can also be enhanced.

Figure 4:
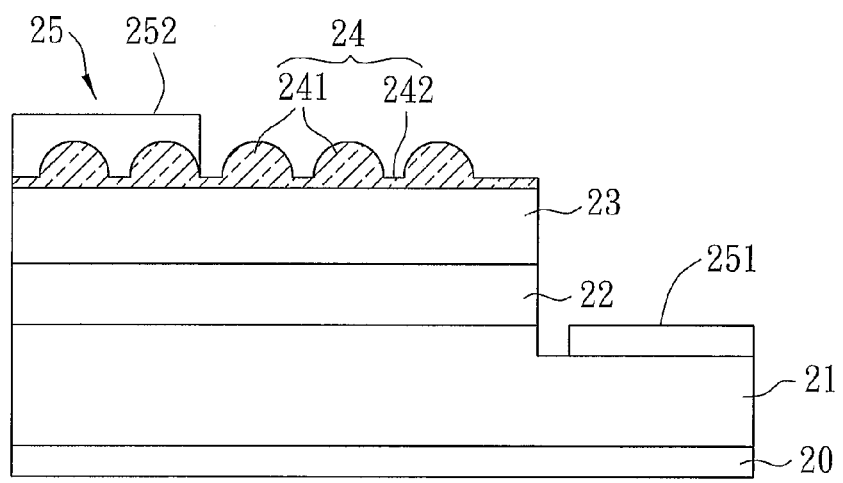
FIG. 4 is a schematic side view of the third preferred embodiment of a light-emitting device according to the present invention.

FIG. 4 illustrates the third preferred embodiment of a light-emitting device according to this invention. The third preferred embodiment is similar to the second preferred embodiment, and differs therefrom in that the epitaxial structure 24 in the third preferred embodiment is configured to further have a plurality of growth islands 241 formed on the epitaxial film 242 oppositely of the p-type semiconductor layer 23. In this embodiment, the vertical electrical transmission efficiency can be enhanced by the provision of the growth islands 241, and the horizontal electrical transmission efficiency can be enhanced by the provision of the epitaxial film 242.

Figure 5:
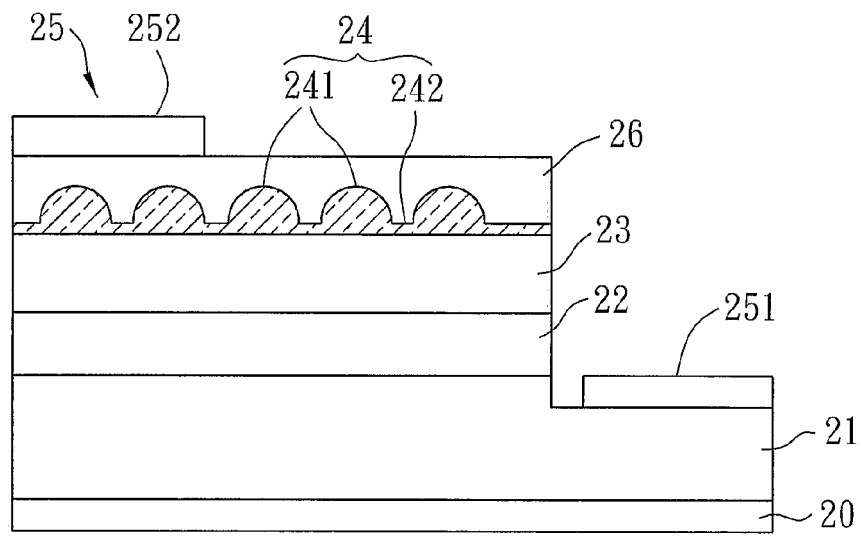
FIG. 5 is a schematic side view of the fourth preferred embodiment of a light-emitting device according to the present invention.

FIG. 5 illustrates the fourth preferred embodiment of a light-emitting device according to this invention. The fourth preferred embodiment is similar to the third preferred embodiment, and differs therefrom in that, in the fourth preferred embodiment, the light-emitting device further comprises a transparent conductive layer 26 that is made of a material different from that of the epitaxial structure 24, and that is disposed to overlay the epitaxial structure 24, and between the second electrode 252 and the epitaxial structure 24. Specifically, the epitaxial structure 24 is electrically connected to the second electrode 252 through the transparent conductive layer 26. With the provision of the epitaxial structure 24 and the transparent conductive layer 26, electric current can be more evenly transmitted to the light-emitting layer 22.

The material of the transparent conductive layer 26 is a transparent metal oxide or a transparent metal. The transparent metal oxide may be indium tin oxide (ITO), indium zinc oxide (IZO), indium tin zinc oxide (ITZO), zinc oxide, aluminum tin oxide (ATO), aluminum zinc oxide (AZO), cadmium indium oxide (CIO), cadmium zinc oxide (CZO), gallium zinc oxide (GZO), fluorine tin oxide (FTO), or combinations thereof. A transparent metal refers to a metal material that can be formed to be ultra thin so as to permit light to pass therethrough. The transparent metal may be nickel, gold, or a combination thereof. In this embodiment, the transparent conductive layer 26 is made of ITO. The transparent conductive layer 26 may be amorphous or polycrystalline. Preferably, the transparent conductive layer 26 is of a cubic crystal system.

Figure 6:
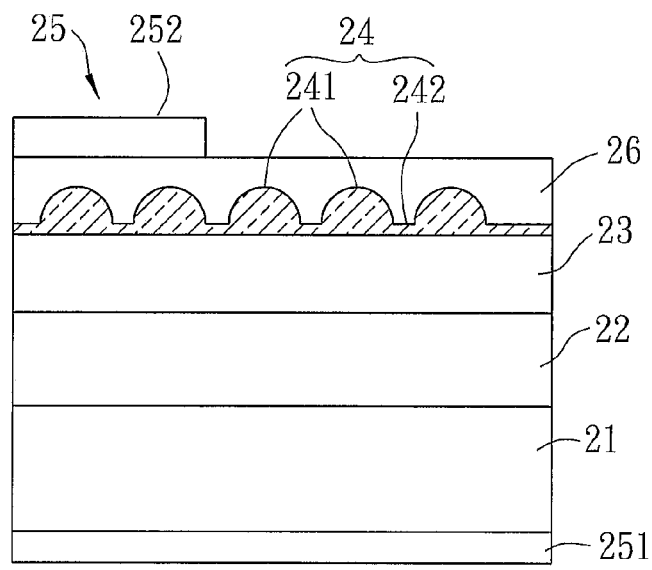
FIG. 6 is a schematic side view of the fifth preferred embodiment of a light-emitting device according to the present invention.

FIG. 6 illustrates the fifth preferred embodiment of a light-emitting device according to this invention. The fifth preferred embodiment is similar to the fourth preferred embodiment, and differs therefrom in that, in the fifth preferred embodiment, the light-emitting device is of a vertical type. That is, the substrate 20 for epitaxial growth is replaced by an electrically conductive substrate which also functions as the first electrode 251.

Referring further to FIGS. 2 to 4, the preferred embodiment of a method for manufacturing a light-emitting device according to this invention comprises the steps of: (a) epitaxially growing the first cladding layer 21 (i.e., the n-type semiconductor layer) on the substrate 20, (b) epitaxially growing the light-emitting layer 22, (c) epitaxially growing the second cladding layer 23 (i.e., the p-type semiconductor layer), (d) epitaxially growing the epitaxial structure 24, and (e) forming the electrode unit 25. The n-type semiconductor layer 21, the light-emitting layer 22, and the p-type semiconductor layer 23, each being a hexagonal crystal system, are respectively grown in steps (a) to (c), and the epitaxial structure 24 of an orthorhombic crystal system is grown in step (d). Since steps (a) to (c) and (e) are well-known in the art, a detailed description thereof is omitted herein for the sake of brevity.

Figure 7:
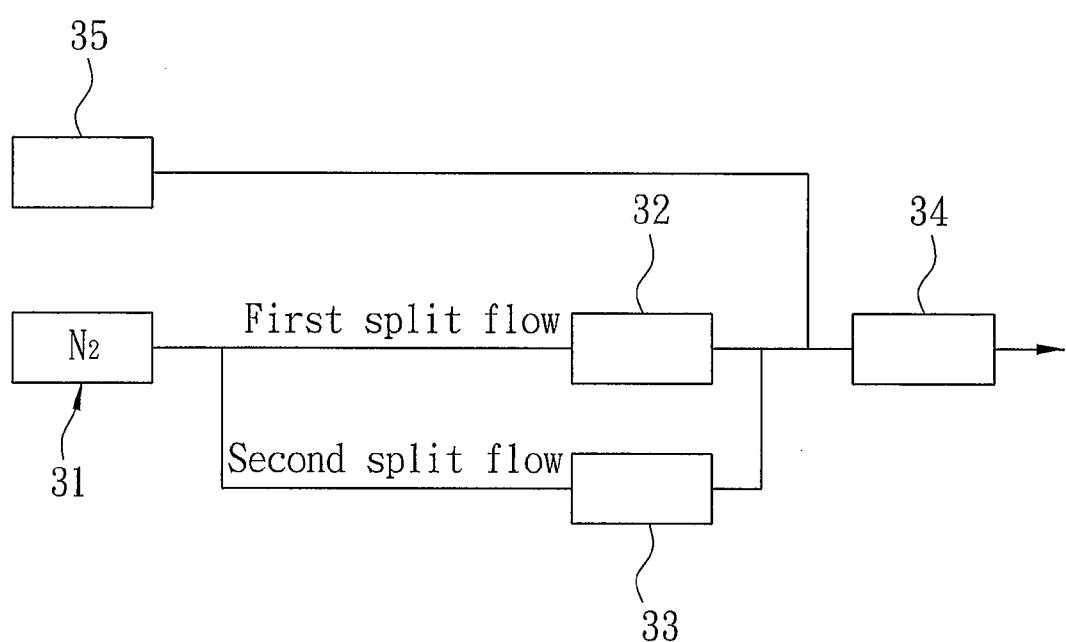
FIG. 7 is a block diagram illustrating a device for epitaxially growing an epitaxial structure of the light-emitting device according to the present invention.

Step (d) includes sub-steps of (d1) to (d3). Referring to FIG. 7, in sub-step (d1), a carrier gas source 31 provides a stream of nitrogen, which is split into a first split flow that passes through a gallium source 32 to entrain a gallium source gas therein, and a second split flow that passes through an indium source 33 to entrain an indium source gas therein, and the two split flows are then converged such that the gallium source gas and the indium source gas entrained in the converged flow are introduced into a growth chamber 34 for growing the epitaxial structure 24. The gallium source gas is a trimethylgallium gas, and the indium source gas is a trimethylindium gas.

In sub-step (d2), an oxygen component source 35 is supplied to the growth chamber 34. The oxygen component source 35 may be $H_2O$, $O_2$, $CO_2$, CO, or combinations thereof.

In step (d3), the epitaxial structure 24 is grown on the p-type semiconductor layer 23 in the growth chamber 34. It should be noted that the epitaxial structure 24 can be grown in different configurations as shown in FIGS. 2 to 4 by controlling the temperature and the pressure inside the growth chamber 34, the processing time in step (d), a flow rate of the converged flow of the first and second split flows, a flow rate of the oxygen component source, etc.

Preferably, the temperature in the growth chamber 34 ranges from 800° C. to 1100° C., the pressure in the growth chamber 34 ranges from 10 torr to 350 torr, and the processing time ranges from 2 minutes to 10 minutes.

In an example of this invention, an epitaxial structure was epitaxially grown on a p-type semiconductor layer (a p-type gallium nitride) under the following parameters. The temperature in the growth chamber 34 was maintained at 950° C., the pressure in the growth chamber 34 was maintained at 200 torr, and the processing time was about 5 minutes.

Figures 8, 9:
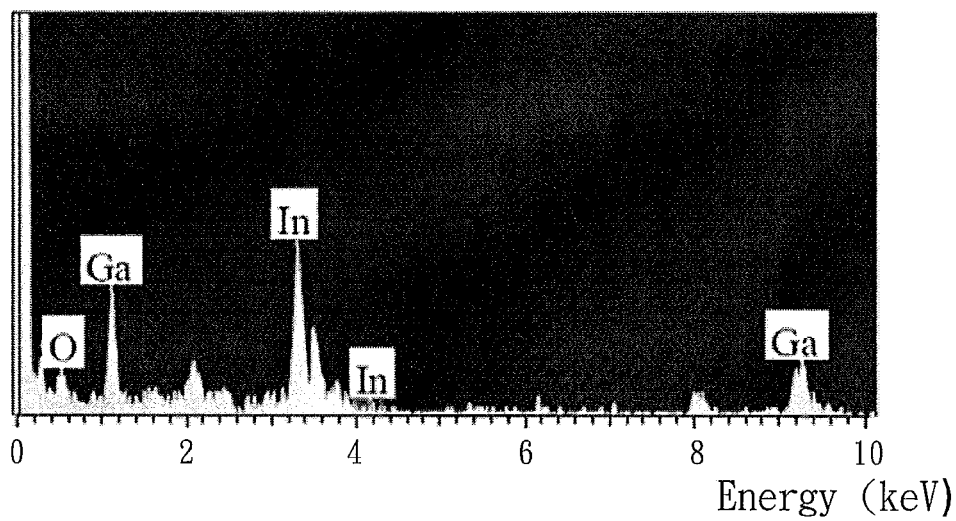
FIG. 8 is an energy dispersive X-ray spectroscopy (EDS) diagram of one point of the epitaxial structure in the light-emitting device of the present invention.
FIG. 9 is a table illustrating an elemental analysis result of FIG. 8.

The epitaxial structure on the p-type semiconductor layer was subsequently observed using a scanning electron microscopy (SEM) and subjected to a chemical composition analysis using an X-ray energy dispersive spectrometry (EDS, JEOL JSM-6700F). FIG. 8 shows an EDS diagram of a point of the epitaxial structure. FIG. 9 shows an elemental analysis result of the EDS diagram shown in FIG. 8. It is found that each of the second cladding layer and the epitaxial structure has a single crystal lattice. The second cladding layer is of a hexagonal crystal system, and the epitaxial structure is of an orthorhombic crystal system.

In other preferred embodiments, as shown in FIGS. 5 and 6, the method of this invention can further comprise a step (f) of forming the transparent conductive layer 26. Preferably, step (f) is implemented by deposition of the transparent metal oxide or the transparent metal using a physical vapor deposition process (such as a sputtering process).

In sum, because the p-type semiconductor layer 23 and the epitaxial structure 24 have single crystal lattices, the epitaxial structure 24 has good adhesion to the p-type semiconductor layer 23, and the contact resistance between the p-type semiconductor layer 23 and the second electrode 252 can be reduced, thereby enhancing the electrical transmission efficiency, especially the hole transmission efficiency of the light-emitting device of this invention. Besides, with the provision of the epitaxial structure 24 and the transparent conductive layer 26, electric current can be more evenly transmitted to the light-emitting layer 22.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A light-emitting device comprising:
   a first cladding layer made of a first-type semiconductor material;
   a light-emitting layer disposed on said first cladding layer to emit light when supplied with external electricity;
   a second cladding layer disposed on said light-emitting layer oppositely of said first cladding layer, and made of a second-type semiconductor material which has an electrical property opposite to that of said first-type semiconductor material;
   an epitaxial structure including an indium-containing oxide, and formed on said second cladding layer oppositely of said light-emitting layer;
   a transparent conductive layer made of a material different from that of said epitaxial structure, and disposed to overlay said epitaxial structure; and
   an electrode unit for supplying the external electricity, including a first electrode disposed to be electrically connected to said first cladding layer, and a second electrode disposed on said transparent conductive layer to be electrically connected to said second cladding layer through said epitaxial structure and said transparent conductive layer such that the external electricity is permitted to be transmitted to said light-emitting layer through said first and second electrodes;

wherein said indium-containing oxide is $In_yGa_{1-y}O$ where $0<y<1$; and wherein each of said first and second cladding layers and said light-emitting layer is made of a gallium nitride based material.

2. The light-emitting device of claim 1, wherein said epitaxial structure is configured to have a plurality of growth islands formed on said second cladding layer.

3. The light-emitting device of claim 1, wherein said epitaxial structure is configured to have an epitaxial film formed on said second cladding layer.

4. The light-emitting device of claim 3, wherein said epitaxial structure is configured to further have a plurality of growth islands formed on said epitaxial film oppositely of said second cladding layer.

5. The light-emitting device of claim 2, wherein said growth islands have a mean width ranging from 30 nm to 300 nm, and a mean height ranging from 10 nm to 20 nm.

6. The light-emitting device of claim 2, wherein a distance between two adjacent ones of said growth islands is greater than 100 nm.

7. The light-emitting device of claim 1, wherein said epitaxial structure is of an orthorhombic crystal system.

8. The light-emitting device of claim 7, wherein each of said first and second cladding layers and said light-emitting layer is of a hexagonal crystal system.

9. The light-emitting device of claim 1, wherein each of said first and second cladding layers, said light-emitting layer, and said epitaxial structure has a single crystal lattice.

10. The light-emitting device of claim 1, wherein said material of said transparent conductive layer is selected from transparent metal oxides and transparent metals.

11. The light-emitting device of claim 10, wherein said transparent metal oxides are selected from the group consisting of indium tin oxide, aluminum zinc oxide, indium zinc oxide, and combinations thereof.

12. The light-emitting device of claim 1, wherein said transparent conductive layer is of a cubic crystal system.

13. The light-emitting device of claim 1, wherein said transparent conductive layer is amorphous or polycrystalline.

14. A method for manufacturing a light-emitting device, comprising the steps of:

(a) epitaxially growing a first cladding layer on a substrate, the first cladding layer being made of a first-type semiconductor material;

(b) epitaxially growing a light-emitting layer on the first cladding layer, the light-emitting layer being capable of emitting light when supplied with an external electricity;

(c) epitaxially growing a second cladding layer on the light-emitting layer, the second cladding layer being made of a second-type semiconductor material which has an electrical property opposite to that of the first-type semiconductor material;

(d) epitaxially growing an epitaxial structure on the second cladding layer, the epitaxial structure including an indium-containing oxide which is $In_yGa_{1-y}O$ where $0<y<1$;

(e1) forming a transparent conductive layer such that the transparent conductive layer is disposed to overlay the epitaxial structure, the transparent conductive layer being made of a material different from that of the epitaxial structure; and (e2) forming a first electrode to be electrically connected to the first cladding layer, and forming a second electrode on the transparent conductive layer so as to be electrically connected to the second cladding layer through the epitaxial structure and the transparent conductive layer, such that the external electricity is permitted to be transmitted to the light-emitting layer through the first and second electrodes;

wherein each of the first and second cladding layers and the light-emitting layer is made of a gallium nitride based material.

15. The method of claim 14, wherein step (d) includes sub-steps of:

(d1) supplying a stream of nitrogen to entrain a gallium source gas and an indium source gas therein so as to introduce the gallium source gas and the indium source gas into a growth chamber for growing the epitaxial structure; and (d2) supplying an oxygen component source to the growth chamber.

16. The method of claim 14, wherein the first cladding layer, the light-emitting layer, and the second cladding layer are of a hexagonal crystal system and are respectively grown in steps (a) to (c), and the epitaxial structure is of an orthorhombic crystal system and is grown in step (d).

* * * * *